United States Patent [19]
Dahl

[11] Patent Number: 6,051,888
[45] Date of Patent: Apr. 18, 2000

[54] SEMICONDUCTOR PACKAGE AND METHOD FOR INCREASED THERMAL DISSIPATION OF FLIP-CHIP SEMICONDUCTOR PACKAGE

[75] Inventor: Alex Dahl, Lewisville, Tex.

[73] Assignee: Texas Instruments Incorporated, Dallas, Tex.

[21] Appl. No.: 09/056,570

[22] Filed: Apr. 7, 1998

Related U.S. Application Data

[60] Provisional application No. 60/042,753, Apr. 7, 1997.

[51] Int. Cl.[7] ................................................ H01L 23/48
[52] U.S. Cl. ........................... 257/778; 257/712; 257/723
[58] Field of Search .................................... 257/712, 778, 257/738, 739, 787, 723

[56] References Cited

U.S. PATENT DOCUMENTS

| | | | |
|---|---|---|---|
| 5,077,633 | 12/1991 | Freyman et al. | 361/403 |
| 5,289,337 | 2/1994 | Aghazadeh | 361/718 |
| 5,291,371 | 3/1994 | Gruber et al. | 361/705 |
| 5,367,196 | 11/1994 | Mahulikar et al. | 257/787 |
| 5,442,234 | 8/1995 | Liang | 257/675 |
| 5,510,649 | 4/1996 | Adhihetty et al. | 257/675 |
| 5,883,430 | 3/1999 | Johnson et al. | 257/712 |
| 5,909,057 | 6/1999 | McCormick et al. | 257/712 |

*Primary Examiner*—Carl Whitehead, Jr.
*Assistant Examiner*—Roy Potter
*Attorney, Agent, or Firm*—W. Daniel Swayze, Jr.; Wade James Brady, III; Frederick J. Telecky, Jr.

[57] ABSTRACT

The invention is a flip-chip semiconductor package (10) and the method of making, which includes a semiconductor chip (12) having face and back sides. The semiconductor chip (12) is connected face side to an insulated package base (11) utilizing solder balls (22). A heat spreader lid (17) is sealed to the back side of the semiconductor chip (12) and to the package base (11) with an electrically and thermally conductive adhesive (14,16).

3 Claims, 4 Drawing Sheets

SEMICONDUCTOR PACKAGE AND METHOD FOR INCREASED THERMAL DISSIPATION OF FLIP-CHIP SEMICONDUCTOR PACKAGE

This application claims priority under 35 USC § 119(e)(1) of provisional application Ser. No. 60/042,753 filed Apr. 7, 1997.

FIELD OF THE INVENTION

This invention relates to semiconductor devices, and more particularly to a package, and method of making, for providing increased thermal dissipation for Flip-Chip semiconductor devices.

BACKGROUND OF THE INVENTION

High powered flip-chip packages require thermal dissipation from the back side of the semiconductor chip. Heat has been dissipated from semiconductor chips by the use of heat spreaders connected to the lead frame die bond pad, or through thermally conductive, and electrically nonconductive epoxy materials. This method is shown in U.S. Pat. No. 5,510,649 where the semiconductor die is first connected to an insulating layer of material which is then bonded to a heat spreader by an epoxy.

Thermal grease has been used to transfer heat from the semiconductor die to a heat spreader. In U.S. Pat. No. 5,442,234, a heat sink is attached to one side of a die-attach paddle using a layer of thermal grease between the heat sink and the die attach paddle. In this method, the thermal grease is applied to one side of the die attach paddle and the semiconductor die is attached to the opposite side of the die attach paddle.

In U.S. Pat. No. 5,289,337, flip-chip devices have been glued directly to a heat spreader by a thermal conductivity and low modulus cement. One or more electrically passive thermal shunt chips are disposed between the substrate and the heat spreader plate for heat conduction. In one embodiment, thermal grease is interposed between the heat spreader plate and the semiconductor chips.

The ability of thermal grease to transfer heat from flip chip devices is limited and mechanical adhesion over the life of the device with thermal grease is questionable. Also, when thermal grease is used, an additional material is required to adhere the package lid to the device after the thermal grease is applied to the package.

SUMMARY OF THE INVENTION

The invention is a flip-chip semiconductor package and the method of making, which includes a semiconductor chip having face and back sides. The semiconductor device is connected face side to an insulated package base utilizing solder ball contacts. A heat spreader lid is sealed to the back side of the semiconductor device and to the package base with an electrically and thermally conductive adhesive, which is dispensed or applied in the form of a preform.

The technical advance represented by the invention, as well as the objects thereof, will become apparent from the following description of a preferred embodiment of the invention when considered in conjunction with the accompanying drawings, and the novel features set forth in the appended claims.

DESCRIPTION OF A PREFERRED EMBODIMENT

Figure 1:
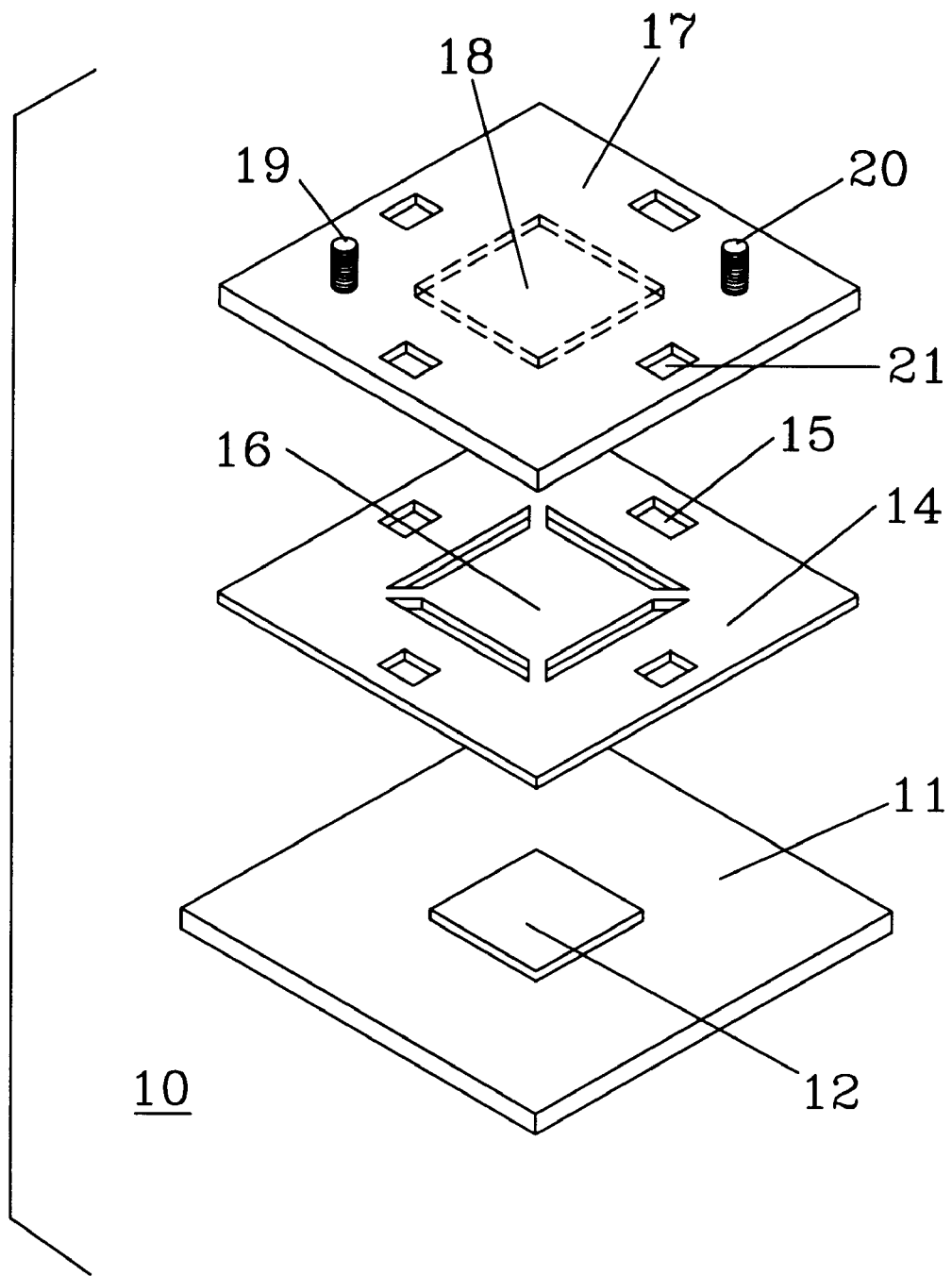
FIG. 1 is an exploded isometric view of a flip-chip package of the present invention.

FIG. 1 is an exploded view of the present invention showing a flip-chip package 10. Semiconductor device 12 is mounted on substrate 11 which is used to interconnect the various electrical connections 22 (FIG. 2) of semiconductor device 12 to a mounting surface, for example a printed wiring board. A heat spreader/lid 17 is used to seal semiconductor chip 12 inside of the package 10 made up of the base 11 and lid 17 which, in the present example, is also a heat spreader. Heat spreader/lid 17 has a cavity 18 on its under side in which semiconductor device 12 resides when lid 17 is sealed to base 11. Lid 17 also has two mounting studs 19 and 20. Lid 17 may also have a plurality of openings 21 which may expose contacts on base 11 (not illustrated) to which passive components may be attached.

A sealing preform 13 is placed between base 11 and lid 17. Epoxy preform 13 is of a conductive epoxy, for example, a silver filled epoxy, which serves both to ground the back side of semiconductor device 12 to lid 17, and to provide a heat conductive path from semiconductor device 12 to heat spreader lid 17. Preform 13 has an outer periphery part 14 which seals the surface of base 11 to the surface of lid 17, and a smaller surface part 16 which seals the top of semiconductor device 12 to the top of cavity 18, providing the largest possible area for heat conduction from both the base 11 and device 12 to heat spreader lid 17. Surface part 16 is joined to peripheral part 14 to provide for exact placement of the two parts over the respective device 12 and base 11. The exact shape and positioning of the relative parts of epoxy 13 depends upon the configuration of the mounting base and device mounted thereon.

Epoxy 13 has a plurality of openings 15 to corresponding to the openings 21 of lid 17.

An example of a preform material that may be use is designated as ABLEBOND 8360, manufactured by Ablestik, a subsidiary of National Starch and Chemical Company. Other suitable electrical and heat conductive adhesive materials may be used.

Figure 3:
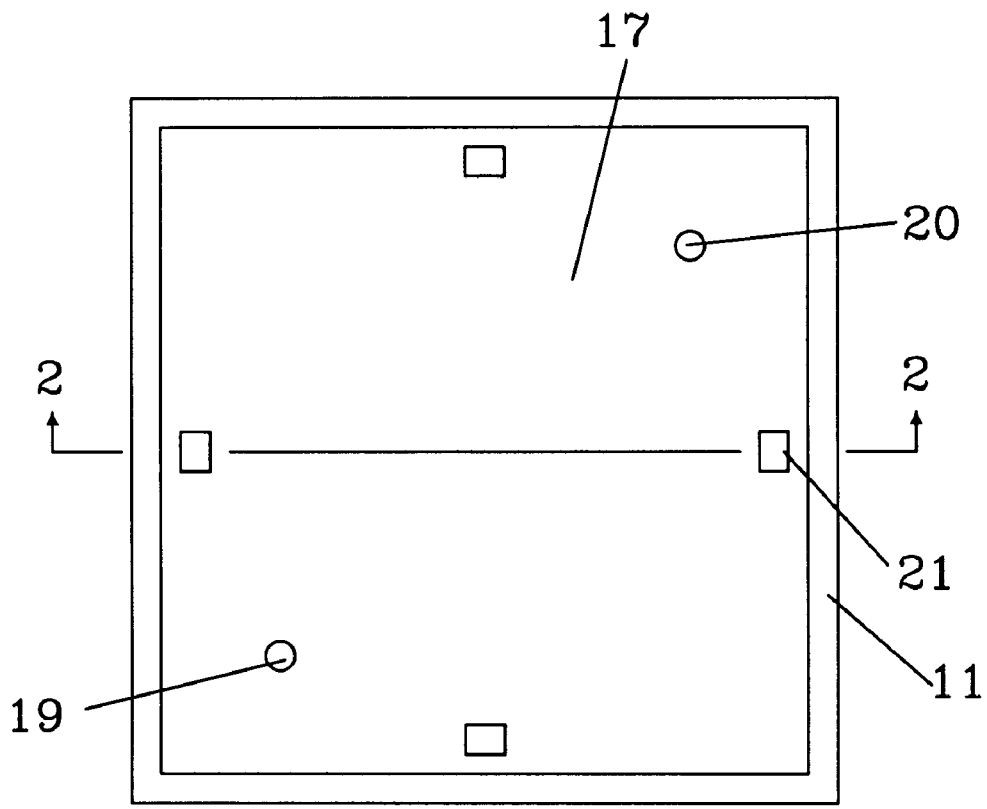
FIG. 3 is a top view of the package.
Figure 2:
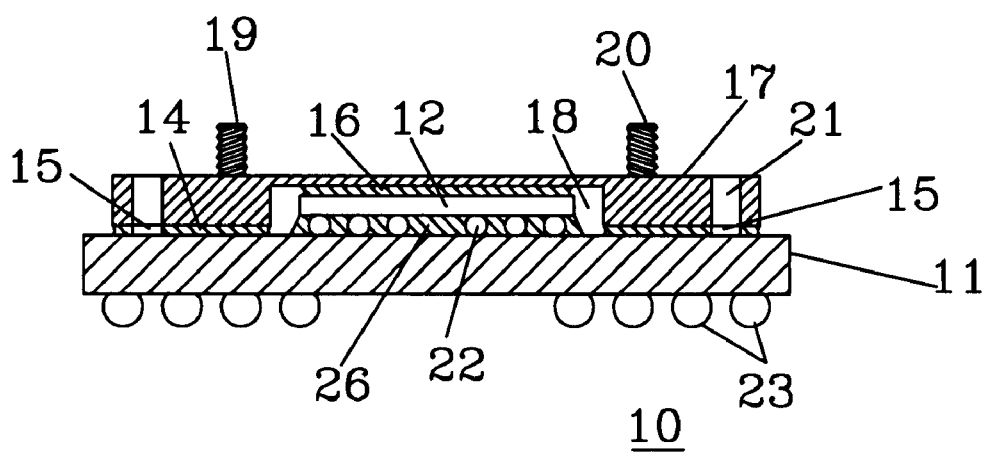
FIG. 2 is a cross-sectional view, taken through section 2—2 of FIG. 3, of the assembled package.

FIG. 2 is a cross-sectional view of flip-chip package 10, taken through section 2—2 of FIG. 3. Flip-chip device 12 is mounted on base 11 with solder ball contacts 22. An under-fill material 26 may be used around contacts 22, and between device 12 and base 11. Contacts 22 are connected to conductors (not illustrated) that extend through base 11 to solder ball contacts 23. Solder ball contacts 23 are used to interconnect package 10 with a printed wiring board (not illustrated) upon which package 10 is mounted.

Lid-heat spreader 17 is shown mounted over device 12 with device 12 in cavity 18. Preform part 14 is between base 11 and lid 17, sealing lid 17 to base 11. Preform part 16 is between the top of cavity 18 and device 12 sealing the top of device 12 to lid 17, grounding device to heat spreader 17 and providing maximum heat transfer.

Openings 15 in adhesive form 13 and openings 21 in lid 17 are shown exposing a small surface area of base 11 through each opening.

FIG. 3 is a top view of package 10 showing mounting studs 19 and 20, and openings 21. Section 2—2 shows the location of the cross-sectional view of FIG. 2

Figure 4:
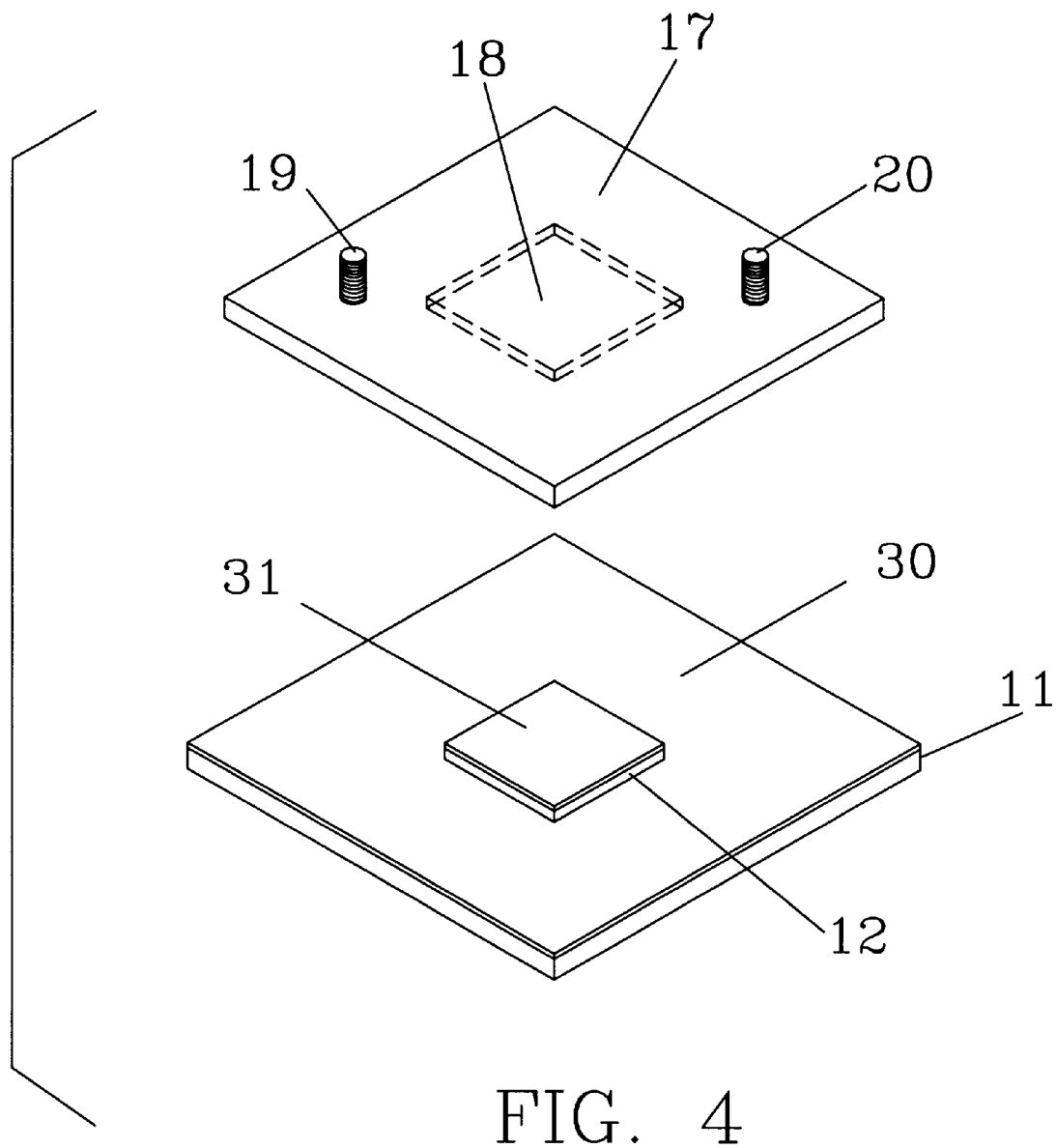
FIG. 4 is a modified package of the package of FIG. 1.

FIG. 4 shows the semiconductor package of FIG. 1, without epoxy preform 13. In FIG. 4., a coating 31 of a silver filled adhesive epoxy, or an electrically conductive adhesive epoxy, for example, one of ABLEBOND 8360 and 8700E, manufactured by Ablestik, a subsidiary of National Starch and Chemical Company, is applied to to the back side of semiconductor 12, and a coating of an adhesive epoxy 31, for example ABLEBOND 71-2, is applied base 11. The results is the same as using an adhesive preform, except that the adhesive epoxy 30 can be different from the conductive adhesive epoxy 31 used to seal semiconductor 12 to heat spreader/lid 17. Epoxy 30 can have, for example, a high mechanical strength with a low coeficient of expansion, while conductive epoxy 31 can have, for example, a low mechanical strength and a low modulus to provide a more flexible heat conductive adhesive layer, providing a good thermal path from device 12 to heat spreader 17.

Figure 5:
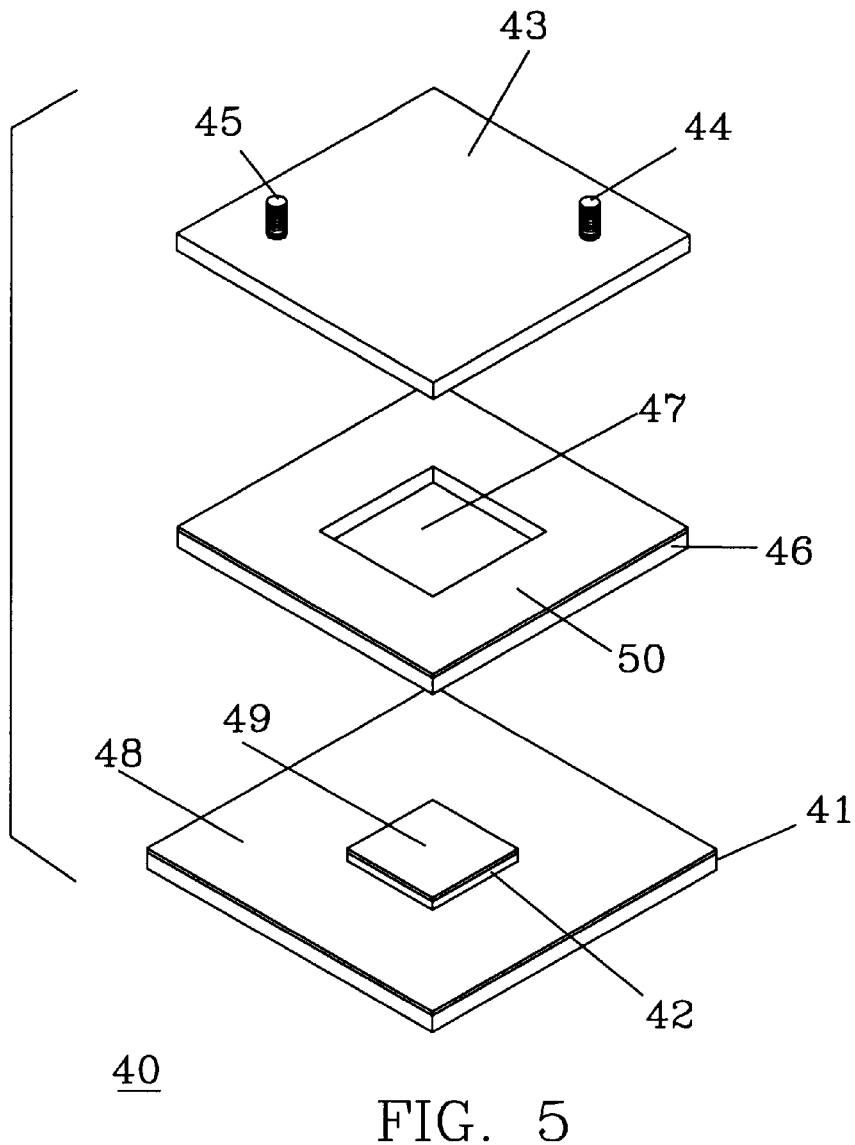
FIG. 5 is a second embodiment of a flip-chip package.

FIG. 5 is an exploded isometric view of a second embodiment of the invention in which a seal 46, with opening 47, is positioned between flat heat spreader 43 and base 41, and attached thereto by an epoxy adhesive film or a high temperature solder. Seal 46 completely surrounds device 42. A thermally and electrically conductive epoxy 49 is dispensed onto the top of device 42 to seal it to heat spreader 43. Similarly, an adhesive epoxy 50 is deposited on seal 46 to attach seal 46 to heat spreader 43. Heat spreader 43 has two mounting studs 44 and 45.

Figure 6:
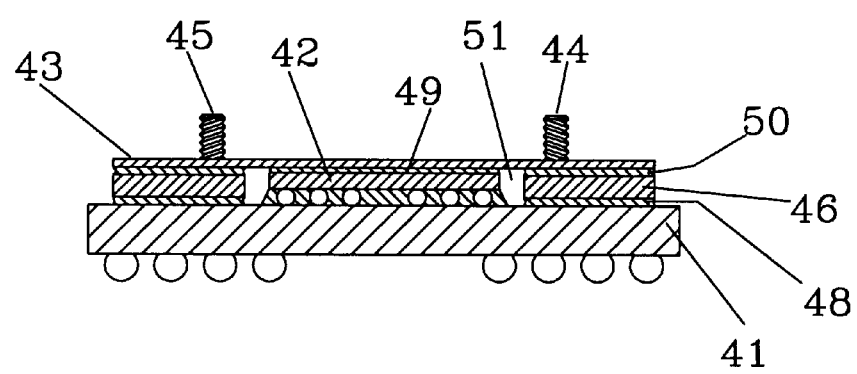
FIG. 6 is a cross-sectional view of the package of FIG. 5.

FIG. 6 is a cross-sectional view of Package 40 showing seal 46 attached to base 41 with adhesive 48, and to heat spreader 42 with adhesive 50. Device 42 is sealed to heat spreader 43 with electrically and thermally conductive epoxy 49. Seal 46 can be larger or smaller making the cavity 51 around device 42 larger or smaller, and may be square as shown, or in the form or a ring.

In all the above embodiments, the heat spreader can be of copper, a copper alloy, or other high heat conductive material.

The advantages presented by the present package are the increased thermal dissipation from the semiconductor chip to the heat spreader lid, semiconductor chip backside grounding to the heat spreader, no voids in the epoxy adhesive affecting the thermal path, and only one material is required to secure the lid/heat spreader to the package base.

What is claimed:

1. A flip-chip semiconductor package;

a semiconductor chip having face and back sides;

an insulated package base to which the semiconductor device face is mounted, and connected thereto by solder ball contacts;

a heat spreader lid; and an electrically and thermally conductive adhesive attaching the heat spreader lid to the back side of the semiconductor chip and the package base, wherein said adhesive is a silver filled epoxy.

2. A flip-chip semiconductor package;

a semiconductor chip having face and back sides;

an insulated package base to which the semiconductor device face is mounted, and connected thereto by solder ball contacts;

a heat spreader lid; and an electrically and thermally conductive adhesive attaching the heat spreader lid to the back side of the semiconductor chip and the package base, including openings in the heat spreader for mounting discrete components.

3. A flip-chip semiconductor package;

a semiconductor chip having face and back sides;

an insulated package base to which the semiconductor device face is mounted;

a heat spreader lid; and an electrically and thermally conductive adhesive attaching the heat spreader lid to the back side of the semiconductor chip and the package base, wherein said adhesive is a silver filled epoxy.

* * * * *